United States Patent
Koehl et al.

(10) Patent No.: US 7,490,310 B2
(45) Date of Patent: Feb. 10, 2009

(54) METHOD FOR CREATING A LAYOUT FOR AN ELECTRONIC CIRCUIT

(75) Inventors: Juergen Koehl, Well un Schoenbuch (DE); Urich Kranch, Dettenbausen (DE); Juerge Pilk, Sougart (DE); Alexander Woerner, Bochingen (DE); Helmut Zudrell, Willdberg (DE)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 11/535,511

(22) Filed: Sep. 27, 2006

(65) Prior Publication Data
US 2007/0089079 A1    Apr. 19, 2007

(30) Foreign Application Priority Data
Oct. 13, 2005    (EP)    ................... 05109519

(51) Int. Cl.
*G06F 17/50*    (2006.01)
(52) U.S. Cl. ................ 716/11; 716/2; 716/10; 716/12; 716/18

(58) Field of Classification Search ............. 716/2, 716/11, 12, 18
See application file for complete search history.

(56) References Cited

U.S. PATENT DOCUMENTS 5,789,770 A * 8/1998 Rostoker et al. ............ 257/206

* cited by examiner

*Primary Examiner*—Thuan Do
(74) *Attorney, Agent, or Firm*—Lynn L. Augspurger

(57) ABSTRACT

The present invention relates to creating a layout of an electronic circuit from a netlist of interconnected components, wherein the components can be represented by planar geometric shapes in the layout. The advantages of the present invention are achieved by tightly coupling placement and routing. An initial placement of shapes of extended size is succeeded by a routing step that tries to create wires between shapes of reduced size. If that fails, it is tried to wire shapes of extended size instead. The wiring can be combined with a delta-placement of shapes within shapes of extended size such that wires connected to shapes of extended size also connect to the shapes.

6 Claims, 7 Drawing Sheets

METHOD FOR CREATING A LAYOUT FOR AN ELECTRONIC CIRCUIT

BACKGROUND OF THE INVENTION

The present invention generally relates to the design of electronic circuits such as semiconductor integrated circuit (IC) devices and printed circuit boards. Particularly, the present invention relates to a method, a tool and a computer program product for creating a layout for an electronic circuit.

An IC layout is the representation of an IC in terms of planar geometric shapes that correspond to patterns of shapes actually drawn on photo masks used in semiconductor device fabrication. A printed circuit board, hereinafter called board, consists of "printed wires" attached to a sheet of insulator. A board layout is the representation of a board in terms of planar geometric shapes that correspond to pattern of shapes actually drawn of photo masks used in the board device fabrication.

Optimal layouts cannot be found in a reasonable time. Even simplified versions of the problem have been proved to be NP-complete or NP-hard according to the computational complexity theory. In practice, the layout problem is broken up into several phases such as floorplanning, placement, and routing. With the large sizes of modern board and IC designs, the phases are usually performed with automatic or semi-automatic electronic design automation tools.

Floorplanning is a preparatory step of creating an IC die map showing the expected locations for various elements of the IC. Placement and routing, also called place and route, are similar at a high-level for both ICs and boards, but the actual details are very different. During place and route board components (blocks) are placed on a board design and the wires are drawn between them and for ICs a layout of a larger block of the IC or the whole IC is created from layouts of smaller sub-blocks. The type of blocks and the actual place and route process itself depends on design methodology.

Due to its complexity the place and route process is usually performed in two separate stages: placement, i.e., determining the positions of the sub-blocks in the design area, and routing, i.e., interconnecting the sub-blocks while keeping the positions of the sub-blocks. Placement is considered as the most important phase of the IC layout design because of its difficulty. The result of the placement directly affects IC area, routeability, and performance. However, also the importance of routing is increasing continuously.

There are three basic styles of routing tools on the market: grid-based routers, shape-based routers, and graph-based routers. A grid-based router superimposes a mesh-like template over the routing area of design with evenly spaced tracks, all grids, running both vertically and horizontally across the design area. Any routing operation that is performed must be cognizant of all the grid points as a whole. A shape-based router in contrast does not need such a grid. A graph-based router views a design similarly to a grid-based router in that there are both vertical and horizontal grids that can be followed, but it only considers these grids as a guideline for routing and is not mandated to use them.

The blocks and sub-blocks that form an IC or a board can be divided in different hierarchy levels: the device level comprising elements such as transistors, diodes, and capacitors, the book level comprising elements from a library such as gates (i.e. NAND and NOR circuits) and latches, the macro level comprising complex elements like adders and dividers, the unit level comprising elements from the macro level (i.e. adder) and the chip level comprising elements from the macro and the unit level (i.e. Floating Point Unit), and the board level comprising elements such as ICs.

Both placement and routing are usually performed incrementally. In an iteration step the layout is optimised for various goals while ensuring signal integrity and compliance to various design rules related to the semiconductor manufacturing process. Examples for placement optimisation goals are minimizing the wire-length between the various blocks as the signal delay increases with the wire length, and maximising the wire density to save chip area. Examples for routing optimisation goals are minimizing the wire length, and having the same or similar length for certain wires. If it is not possible to achieve the optimisation goals then the current layout is dropped, the design of the IC will be changed and the placement and routing process is started again.

With the enduring trend of devices (e.g. transistors) and books and macros (e.g. gates) becoming smaller and faster, IC designs are being limited by the delays of the wires connecting the devices and macros rather than by their area. For example, for semiconductor process geometries in the 130 nm range it is reported that wires account for nearly 75% of an IC's overall delay. And nearly 40% of the wires can attribute more than 50% of their total wire capacitance to the cross coupling between neighbouring wires. At smaller geometries (e.g. in toady's 90 nm range), the situation is becoming even more severe.

Another limiting factor for IC designs is the wiring density. As the devices become smaller the wires do not scale to the same amount. The density of the IC is therefore more and more limited by the wiring density and not by the density of the devices. It is necessary to increase the space between the devices to be able to route the IC.

Traditional design methodologies do not consider wire delays and capacitance until after placement since routing is performed after placement at the end of the design flow. Designers must iterate multiple times in hope of achieving design closure. And often, in order to meet a strict schedule for the IC release to manufacturing, designers are forced to accept a lower performing IC or the risk of potential failures due to unresolved signal integrity issues.

SUMMARY OF THE INVENTION

It is therefore an object of the present invention, to provide a method for creating a layout of an electronic circuit that is improved over the prior art and a corresponding tool and a computer program product.

This object is achieved by the invention as defined in the independent claims. Further advantageous embodiments of the present invention are defined in the dependent claims.

According to the present invention the steps placement and routing are tightly coupled. A netlist of interconnected components is used for an initial placement. This placement step is performed by using extended instances that have an increased area compared to the area actually needed for the geometric shape representing the corresponding component. An instance of the component is a regular planar geometric shape with the minimal size required to comprise the area of the planar geometric shape representing the component. In the preferred embodiment of the invention the regular shape of an instance is a rectangular shape. An extended instance is then a scaled instance, hence a scaled rectangular shape.

The increased area for every instance is controlled by a global parameter and by an individual parameter, which can be adjusted for various optimisation goals. For example, instances of components with many interconnections to other components can be increased more than instances for components with fewer interconnections, and instances of timing critical components can be increased less than instances of timing uncritical components.

The initial placement is succeeded by a routing step that tries to create wires for all interconnections between the components. This is done by routing a shrunk instance that has a decreased area compared to the area actually needed for the geometric shape representing a component. In the preferred embodiment the shrunk instance is a scaled instance, especially a scaled rectangular shape.

Also the decreased area for every instance is controlled by a global parameter and by an individual parameter, which can be adjusted for various optimisation goals. If a shrunk instance cannot be wired its corresponding instance or extended instance is tried instead.

The routing can be combined with an additional delta-placement step that moves an instance within its extended instance such that a wire connecting to the extended instance connects to the instance after the delta-placement. Then a new extended instance needs be determined such that subsequent delta-placements are possible without breaking the connection of the wire to the instance.

A delta-placement can also be used to connect two instances directly without additional wires. This is especially useful when a wire cannot be created between these two instances without violating design rules, e.g., when this is prevented by design rules.

When the position of an instance remains fixed in the layout, then the wires connected to this instance will be extended into the instance such that they connect to pins contained in the geometric shape representing the component associated to this instance.

BRIEF DESCRIPTION OF THE DRAWINGS

The present invention and its advantages are now described in conjunction with the accompanying drawings.

DETAILED DESCRIPTION

In the preferred embodiment of the present invention, a layout of an IC will be created. As a starting point, a gate-level netlist description of the IC will be created during the IC development. For example, a register-transfer level netlist can be created by a compiler from a register-transfer level description of the IC in a hardware description language such as VHDL or Verilog. This register-transfer level netlist can then be translated to a gate level netlist using a logic synthesis tool. Hereinafter, the gate level netlist of the IC is called netlist.

The content of the netlist is a list of all devices to be placed on the IC and their logical function. The netlist also contains all the interconnections between these devices. An interconnection is called net and relates to a wire between two or more devices on the IC. For every kind of device a corresponding macro exists in a library. A macro from this library comprises a technology-dependent layout for a certain device.

Figure 1A:
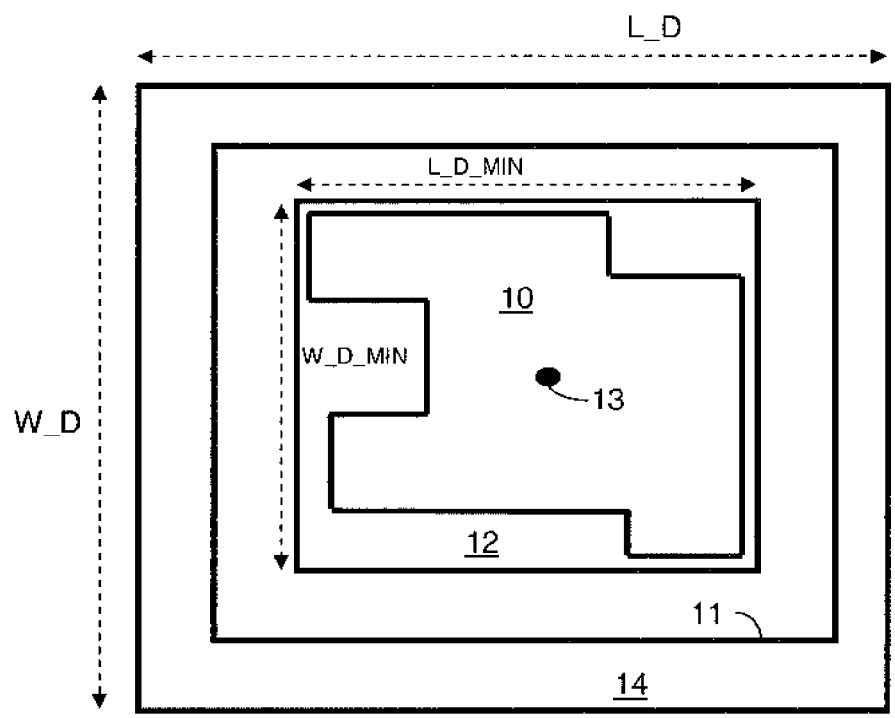
FIG. 1A: Is a block diagram describing various geometric shapes in accordance with the present invention.

The layout contained in a macro describes a planar geometric shape that can be placed anywhere on the IC area. It relates to a semiconductor structure that will be found in the same area of the real IC once it was manufactured. FIG. 1A shows a geometric shape 10 that is described by a layout for a device D as given by an instance of a macro M from the library of macros. The netlist and the library of macros are used by a conventional placement tool for the placement of the devices in the netlist on the area of the IC. In the standard IC development process the resulting layout of the IC and the netlist are then used by a conventional router tool for the routing of the wires on the area of the IC based on the interconnections between the devices in the netlist. An example for such a conventional place and route tool is the Cadence Nano Encounter.

For the geometric shape 10 a rectangle 11 can be defined such that the rectangular shape that is bordered by the rectangle 11 comprises the geometric shape 10. Of the two opposite pairs in the rectangle 11, the length of the longer side is called the length of the rectangle 11 and the length of the shorter side is called the width of the rectangle 11. There are minimum possible values for the length and width of the rectangle 11 such that the area of the geometric shape 10 is completely contained in the area of that rectangular shape. In FIG. 1A this shape is shown as the rectangular shape 12. The location of the centre of the rectangle 11 is the point 13. The terms length, width, and centre can be used conterminously for the rectangular shape that is bordered by the rectangle 11.

The rectangular shape 12 can be used to define a modified instance of the layout of the macro M by changing length and with of the rectangular shape 12. For the present invention existing placement and router tools need to be adapted such that they are able to handle such modified instances.

For the preferred embodiment of the invention, the netlist format is extended such that for every device in the netlist a numeric factor can be stored. This numeric factor could be defined and set in various ways, e.g., in a dedicated automatic pre-processing step using information from a definition file created by a designer, it could be defined by a designer at the hardware language description level already, or it can be set automatically during any step that precedes the creation of the netlist, for example during the logic synthesis.

A netlist containing a numeric value $F\_D$ that is greater or equal to 1 for every device D in the netlist will then be used by a placement tool in order to create an initial placement for the IC described by the netlist. A numeric value F greater or equal to 1 that is same for all devices is used as an additional factor for the initial placement of the netlist. For this step an existing placement tool is adopted to place a rectangular shape 14 as shown in FIG. 1A instead of the geometric shape 10 described by the layout of a macro.

The length $L\_D$ and with $W\_D$ of the rectangular shape 14 are defined as follows:

$$L\_D := L\_D\_MIN * F\_D * F$$

$$W\_D := W\_D\_MIN * F\_D * F$$

where L_D_MIN and W_D_MIN are the length and width of the rectangular shape 12. The centre of the rectangular shape 14 is the centre 13 of the rectangle 11. As both F_D and F are greater or equal to 1, the rectangular shape 14 describes an increased area compared to the geometric shape 12. The rectangular shape 14 that is placed on the area of an IC by a placement tool is called an extended instance of the layout of the macro M.

If, however, F_D is greater 0 and smaller than 1 then the rectangular shape 14 would describe a decreased area compared to the geometric shape 12. Such a rectangular shape 14 is called a shrunk instance of the layout of the macro M.

The factor F_D can be seen as a local parameter related to the device. The factor F, however, can be seen as a global parameter related to the overall design represented by the netlist.

In the preferred embodiment of the invention an existing placement tool is changed such that it places an extended instance instead of an instance of the layout of a macro for all devices in the netlist. This initial placement step can be done by using the normal optimisation goals that would have been used for the conventional placement of the netlist. Compliance to various design rules related to the semiconductor manufacturing process can still be ensured for the initial placement. As one mandatory design rule, the rectangular shapes of the extended instances are not allowed to overlap on the area of the IC as this would constitute short-circuit.

In the preferred embodiment of the invention the IC layout that is the result of the initial placement step will now be processed by an existing router tool. In order to achieve that the tool is adapted such that it tries to route a net to the extended instance or the shrunk instance instead of the instance. If that is successful, then the router tool calls an existing placement tool in order to perform a so-called delta-placement of the instance within the extended instance.

Figure 1B:
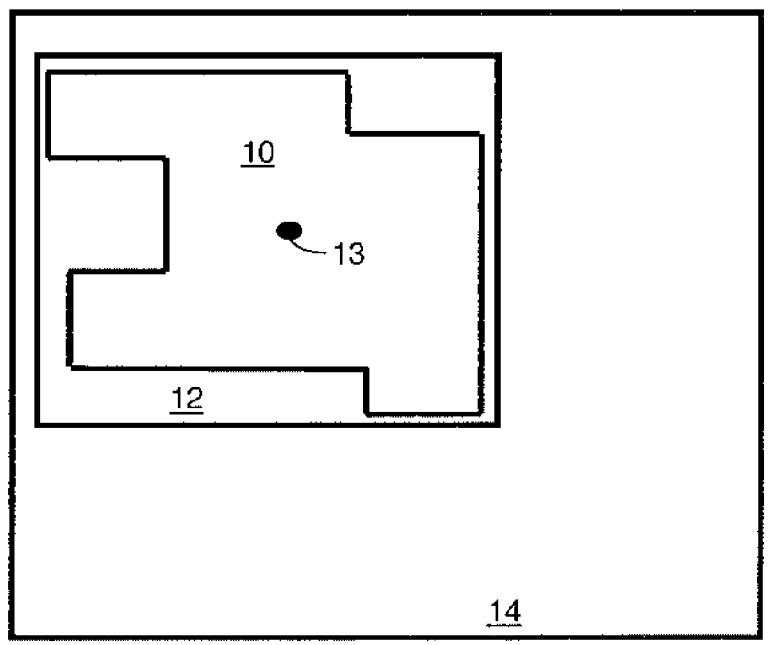
FIG. 1B: Is a block diagram describing various geometric shapes in accordance with the present invention.

A delta-placement of the geometric shape 10 within the rectangular shape 14 is shown in FIG. 1B. It is a movement of the geometric shape 10 within the rectangular shape 14 such that the centre 13 of the rectangular shape 12 and centre of the rectangular shape 14 are different, but the area of the rectangular shape 14 still comprises the area of the geometric shape 10.

Figure 2A:
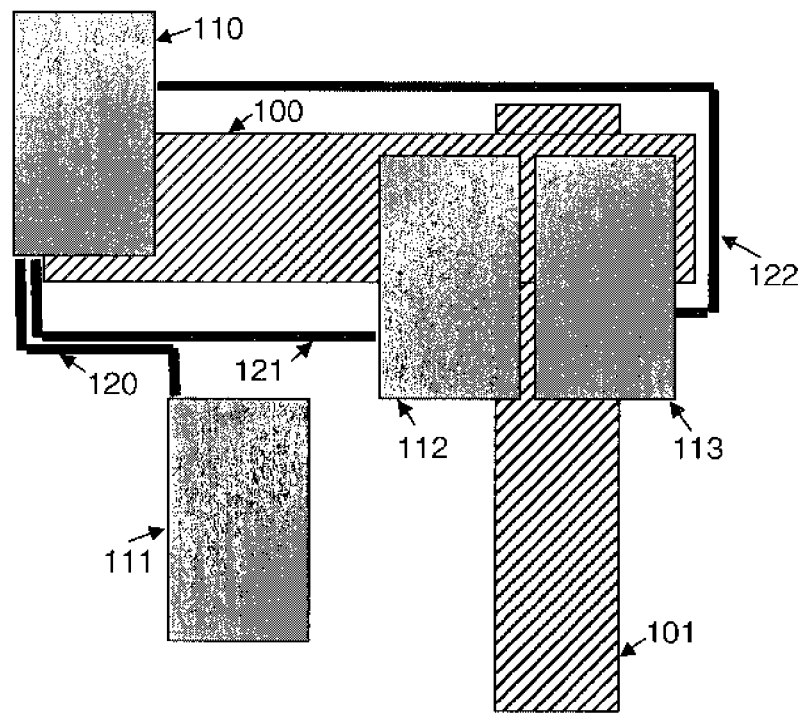
FIG. 2A: Is a block diagram illustrating a layout created by prior-art methods.

FIG. 2A shows a layout created by prior-art placement and routing methods. The instances 100 and 101 represent blockages, i.e., resources that are not available at the current hierarchical level such as a power or clock distribution grid. Their position is fixed, whereas the positions of the instances 110, 111, 112, and 113 can be determined by a prior-art placement method. A subsequent prior-art routing method created the wire 120 between the instances 110 and 111, the wire 121 between the instances 110 and 112, and the wire 122 between the instances 110 and 113. However, prior-art routing methods are unable to create a wire between the instances 112 and 113 as the placement of the instances 100, 101, 112, and 113 does not allow such a connection without violating design rules. The obvious design rule that would be violated in this case is that short-circuits are not allowed.

Figure 2B:
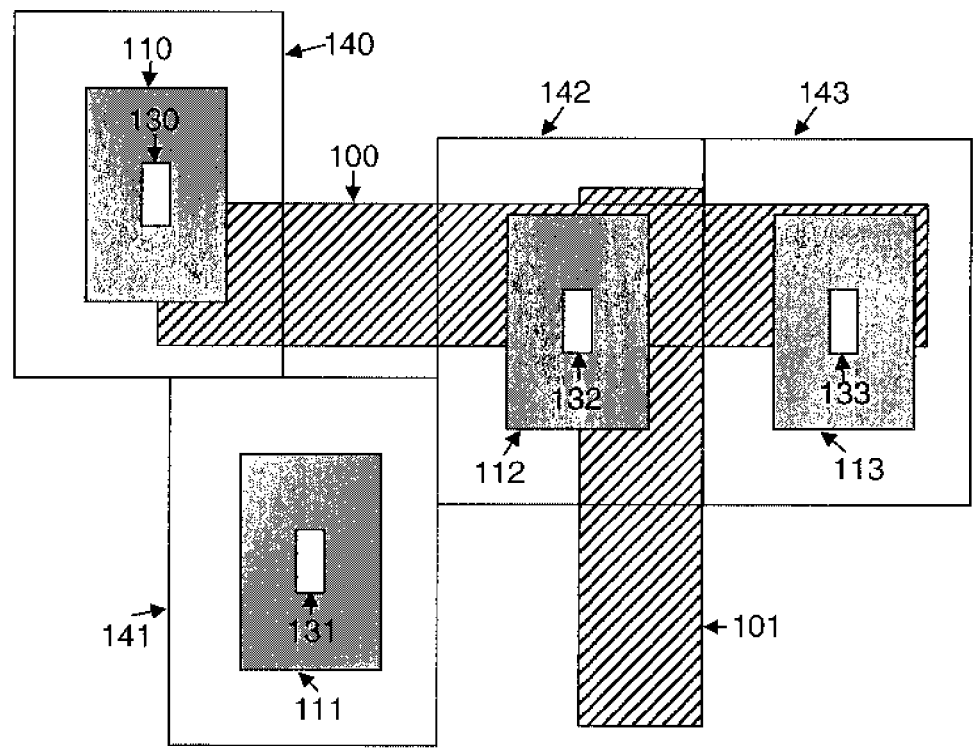
FIG. 2B: Is a block diagram illustrating a placement step in accordance to the present invention.

FIG. 2B is showing a placement step according to the present invention. The fixed placement of the instances 100 and 101 is the starting point. For the instances 110, 111, 112, and 113 shrunk instances 130, 131, 132, and 133 are defined, as well as extended instances 140, 141, 142, and 143. Then the extended instances 140, 141, 142, and 143 are placed using a prior-art method.

Figure 2C:
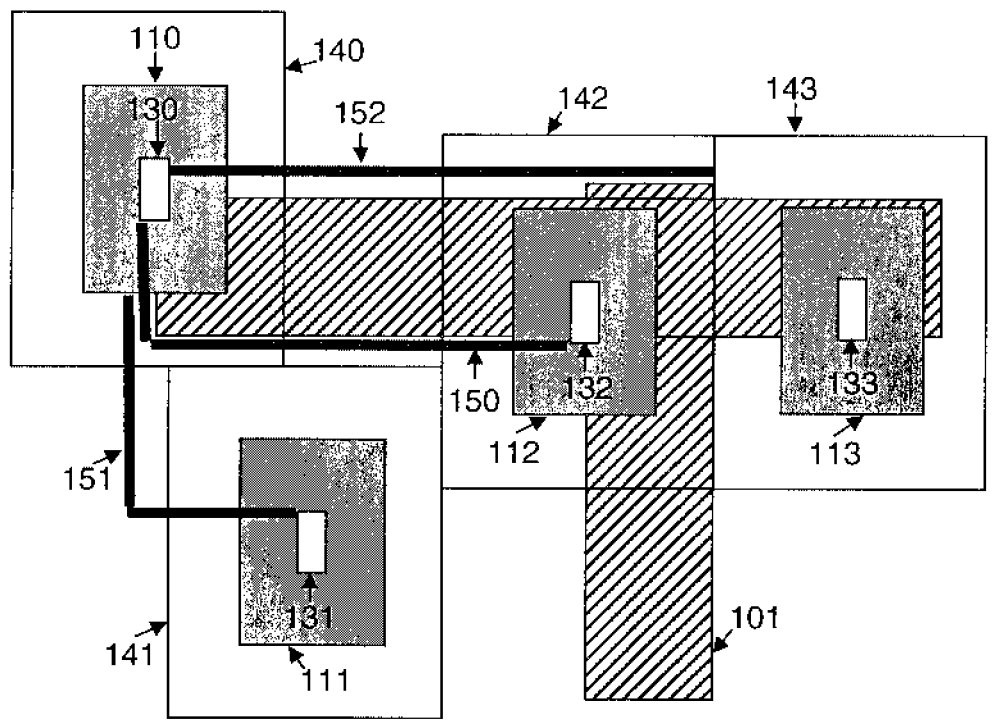
FIG. 2C: Is a block diagram illustrating a routing step in accordance to the present invention.
Figure 2D:
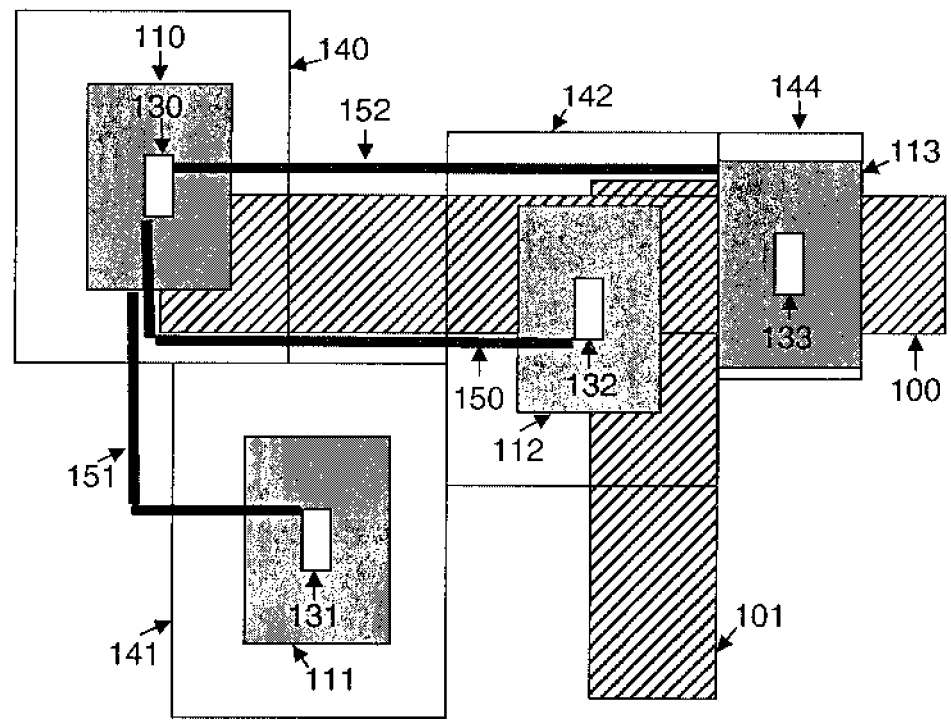
FIG. 2D: Is a block diagram illustrating a placement and routing step in accordance to the present invention.

A placement and routing step according to the present invention is shown in FIG. 2C. First, a wire 150 is created between the shrunk instances 130 and 131. Since a wire between the shrunk instances 131 and 130 cannot be created by achieving the optimisation goals and maintaining the design rules, a wire 151 is created between the shrunk instance 131 and the extended instance 140 instead. The optimisation goals and the design rules prevent also the creation of a wire between the shrunk instances 130 and 133. Therefore a wire is created between the shrunk instance 130 and the extended instance 143. Then, as shown in FIG. 2C, a delta-placement of the instance 113 is performed within its extended instance 143 such that the wire 152 connects the instance 113 with the shrunk instance 130.

Now new extended instances need to be defined for the instances 110, 111, 112, and 113. These new instances need to be defined such that delta-placements of the instances 110, 111, 112, and 113 are possible within their extended instances 140, 141, 142, and 143 without breaking the connection of existing wires to the instances 110, 111, 112, and 113. In this case only a new extended instance 144 needs to be defined for the instance 133.

Figure 2E:
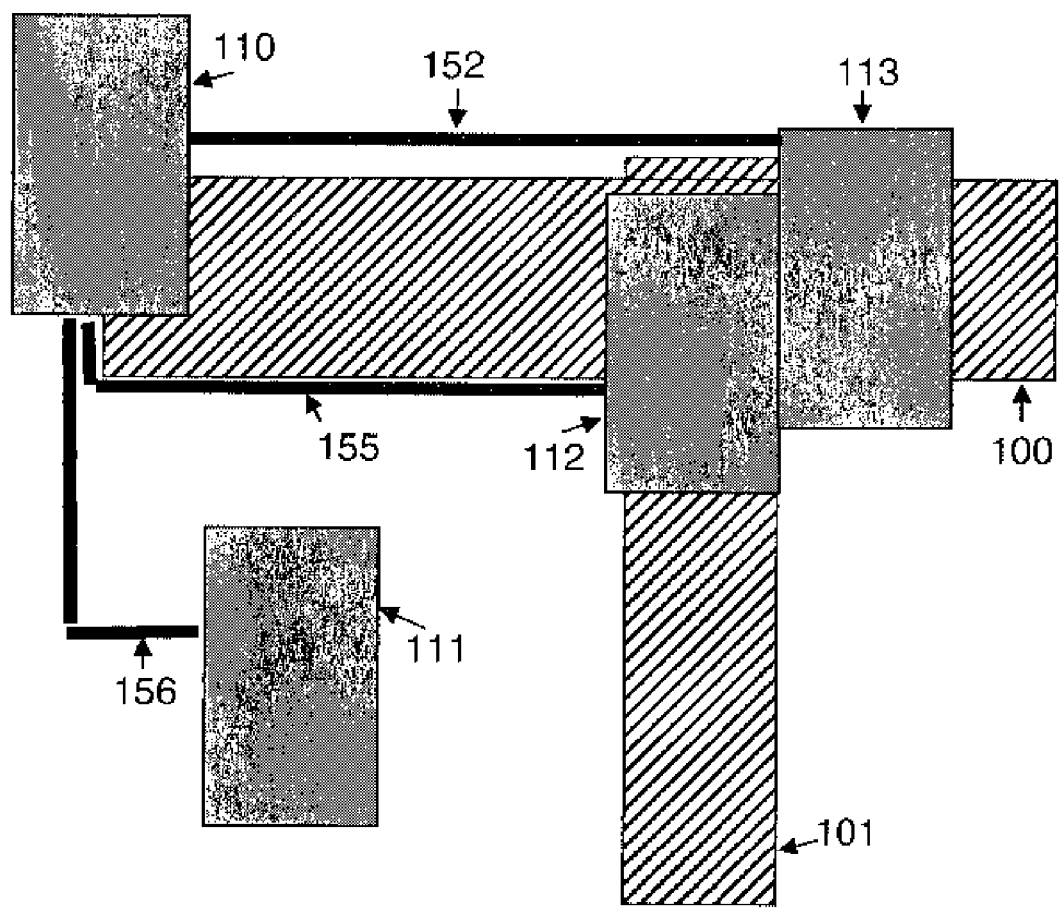
FIG. 2E: Is a diagram illustrating the direct placement connection of the instances 112 and 113 without an additional wire.

As shown in FIG. 2A, prior-art routing methods were not able to create a wire between the instances 112 and 113. A connection between these instances is achieved by a method according to the present invention by performing a delta-placement of the instance 112 within its extended instance 142, such that the instances 112 and 113 are directly connected without an additional wire. This is shown in FIG. 2E. There it is also shown how the wires 150 and 151 are replaced by the wires 155 and 156. The wires 155 and 156 are the result of changes to the wires 150 and 151. These changes are such that the new wires 155 and 156 connect the instances instead of the corresponding extended or shrunk instances.

Various strategies for performing delta-placements are possible. The methods shown in FIG. 3 and 4 differ in this regard. Both methods process a netlist based on an arbitrary list of all the nets contained in the netlist.

Figure 3:
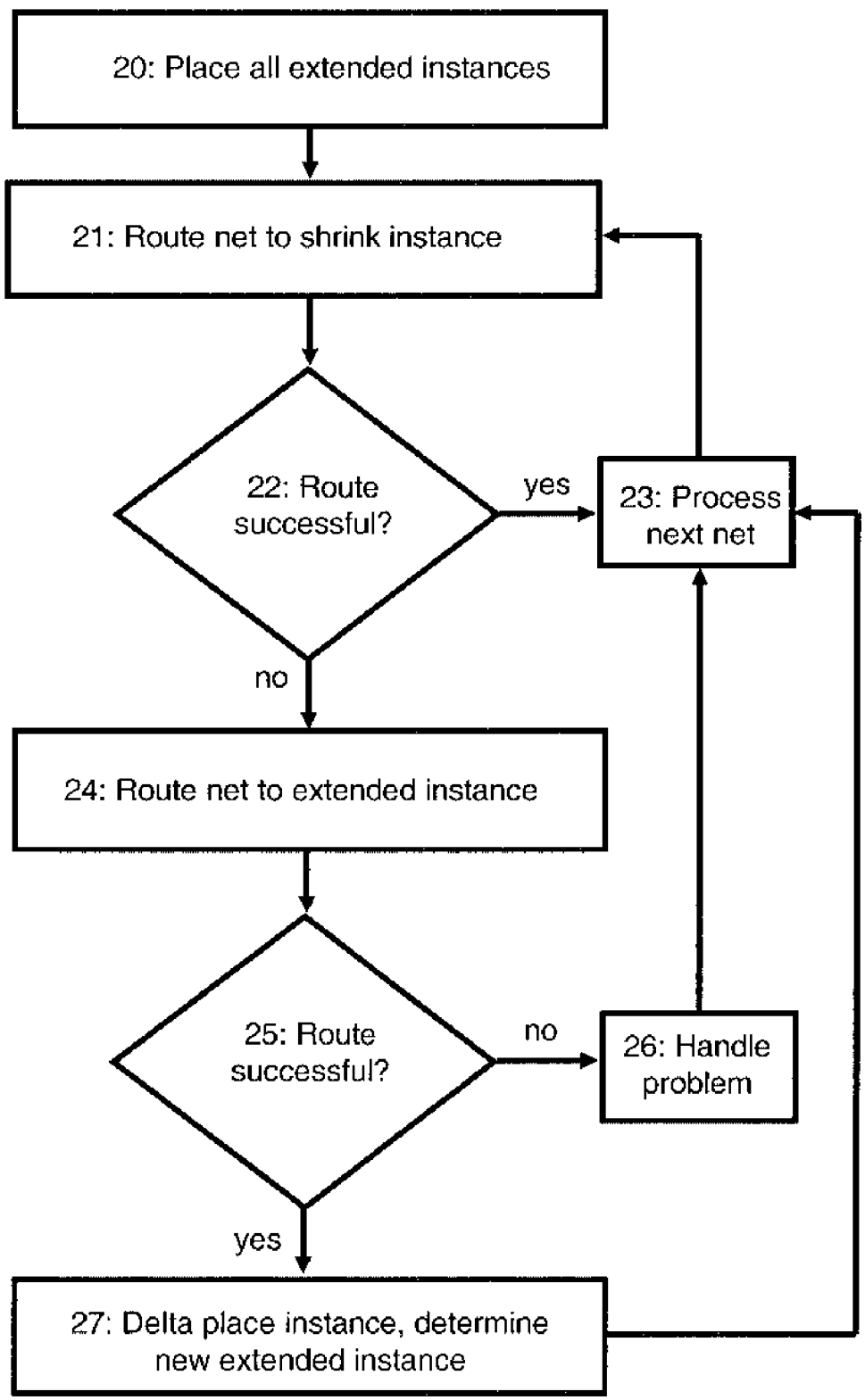
FIG. 3: Is a control flow diagram for a method in accordance with the present invention.

The method shown in FIG. 3 starts with the placement of all extended instances in step 20. Then in step 21 it is tried to create a wire for a net from the netlist using shrunk instances instead of instances. If (step 22) that is successful then the next net is processed in step 23. Otherwise (step 22) it is tried to create a wire using an extended instance instead of a shrunk instance in step 24. If (step 25) that is successful then a delta-placement of the instances that were connected by this wire is performed in step 27 within their respective extended instances such that the wire connects the instances. In the same step 27 new extended instances are determined for these instances such that a delta-placement of the instances can be performed within the new extended instance without breaking the connection of the wire to the instances. If also a wire connecting the extended instances could not be created, then this problem is handled in step 26. After the steps 26 or 27 the next net is processed in step 23.

Figure 4:
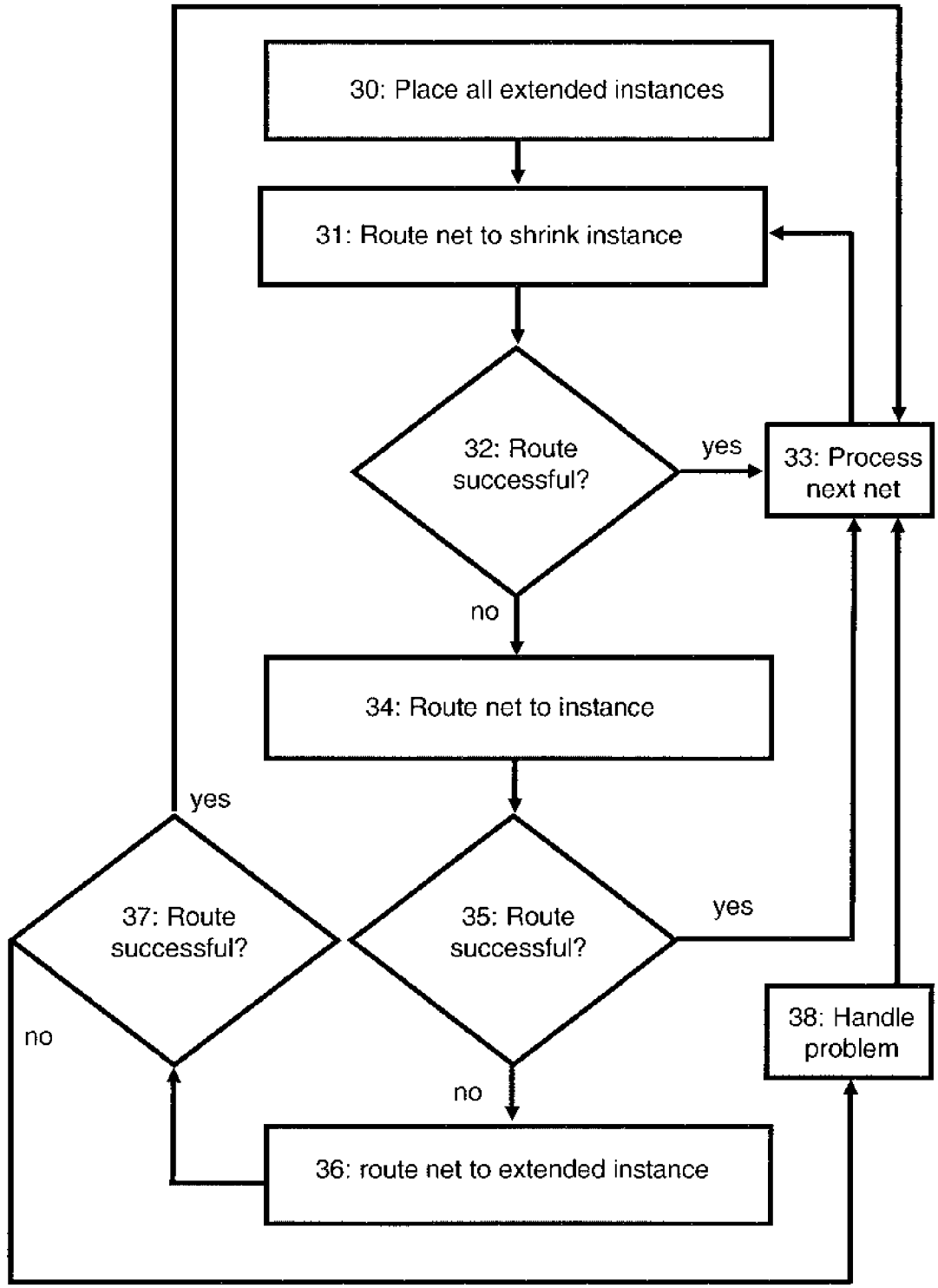
FIG. 4: Is a control flow diagram for a method in accordance with the present invention.

Also the method shown in FIG. 4 starts with the placement of all extended instances in step 30. Then in step 31 it is tried to create a wire for a net from the netlist using shrunk instances instead of instances. If (step 32) that is successful then the next net is processed in step 33. Otherwise (step 32) it is tried to create a wire using an instance instead of a shrunk instance in step 34. If (step 35) that is successful then in step 33 the next net is processed. Otherwise (step 35) it is tried to create a wire to using extended instances instead of instances in step 36. If (step 37) that is successful then the next net is processed in step 33. Otherwise (step 37) the problem is handled in step 38, and then in step 33 the next net is processed.

Once all the nets in the netlist are processed, a delta-placement is performed for all instances within their respective extended instances such that missing connections between instances are resolved by direct connections of instances without additional wires and such that all wires connecting extended instances only are connecting the respective instances.

Figure 5:
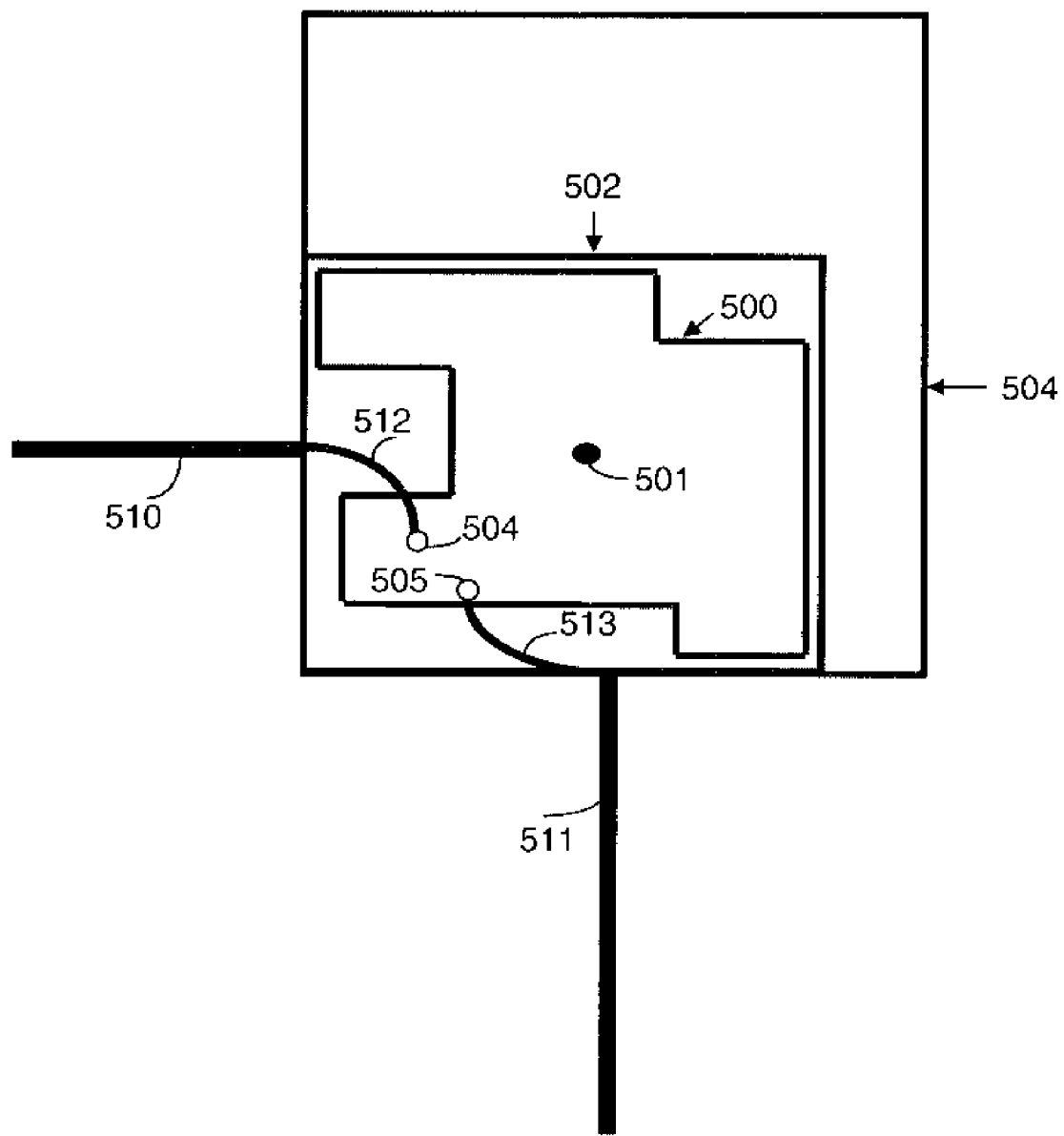
FIG. 5: Is a block diagram illustrating a routing step in accordance with the present invention.

FIG. 5 shows the final routing step in accordance to the present invention. The instance 500 with its centre 501 is contained in the rectangular shape 502 with the same centre 501 and in the extended instance 504. The instance 500 comprises two pins 504 and 505. The extended instance 504 is connected to the wires 510 and 511. These wires need to be connected to the pins 504 and 505. This routing step can be performed by a conventional routing tool that creates the wire 512 connecting the wire 510 with the pin 504, and the wire 513 connecting the wire 511 with the pin 505.

Various modifications of the methods of FIGS. 3 and 4 are possible regarding the start and end points of a wire. It is possible that both the start and end points connect extended instances, shrunk instances, or instances each. But also mixtures are possible, e.g. connecting an extended instance with a shrunk instance.

The present invention can also be used for the creation of a layout for an element from each of the various block hierarchy levels, especially for a board layout. There is no restriction regarding the type of existing placement or routing tool to be adapted and used.

Furthermore, combining both placement and routing allows a better optimisation of the routing. I.e., it allows to minimize the number of jogs of a wire (wire bends) or to minimize the number of metal layer changes of a wire reducing the required number of vias (contact holes connecting two metal layers). Less wire jogs and less vias increase the manufacturing yield for an IC. Instead of routing an instance with a fixed placement only, the delta-placement concept allows to increase the option space for the routing step. For example, it is possible to prevent a metal layer change by an appropriate delta-placement of an instance.

This present invention can be realized in hardware, software, or a combination of hardware and software. It is preferably implemented as software, a sequence of machine-readable instructions. While a particular embodiment has been shown and described, various modifications of the present invention will be apparent to those skilled in the art.

The invention claimed is:

1. A computer-based method for creating a layout for an electronic circuit from a netlist of interconnected components, wherein instances of the components can be represented by regular planar geometric shapes having a periphery around an area defined by the shape of said instances where a wire of said circuit connects components in the layout, the method being characterized by the steps of
creating for each component a nested arrangement of extended, regular, and shrunk instances of said component with enlarged, regular, and diminished dimensions, respectively;
placing all components as extended instances in the layout;
creating connections between two components by placing a wire between one of the instances of the two components, preferably starting with the shrunk instances, then the regular instances and then the extended instances;
establishing connections crossing the periphery of an extended or regular instance with contact points within the corresponding planar geometric shape.

2. The method according to claim 1, with the additional step of
moving a regular instance within its extended instance to contact the wire at the periphery of the extended instance.

3. The method according to claim 2, with the additional steps of
creating a new extended instance for the moved regular instance such that the regular instance can be moved within said new extended instance while the wire at the periphery remains connected to the regular instance.

4. The method according claim 3, with the additional step of
moving said regular instance within said new extended instance to a position where said wire at the periphery is connected to an extended instance to thus connect to the corresponding regular instance to complete the connections when the step of routing the interconnections between components is completed.

5. The method according to claim 4, with the additional step of
moving a regular instance within its extended instance such that the instance directly connects to another regular instance (113) when there is no wire connecting both instances but the corresponding components are interconnected in the netlist.

6. The method according to claim 1, wherein a final connecting step is achieved by placing a new wire from the peripheral point on the periphery of an instance of a component where a wire connects to an instance or extended instance to a contact point within said corresponding instance.

* * * * *